(12) United States Patent
Amali

(10) Patent No.: US 7,566,622 B2
(45) Date of Patent: Jul. 28, 2009

(54) EARLY CONTACT, HIGH CELL DENSITY PROCESS

(75) Inventor: Adam I Amali, Hawthorne, CA (US)

(73) Assignee: International Rectifier Corporation, El Segundo, CA (US)

( * ) Notice: Subject to any disclaimer, the term of this patent is extended or adjusted under 35 U.S.C. 154(b) by 465 days.

(21) Appl. No.: 11/446,877

(22) Filed: Jun. 5, 2006

(65) Prior Publication Data

US 2007/0018241 A1 Jan. 25, 2007

Related U.S. Application Data

(60) Provisional application No. 60/696,855, filed on Jul. 6, 2005.

(51) Int. Cl.
*H01L 21/336* (2006.01)
(52) U.S. Cl. .................. 438/270; 438/272; 438/274; 438/585; 257/E21.419

(58) Field of Classification Search ............ 438/585, 438/270, 589, 271, 272, 273, 274
See application file for complete search history.

(56) References Cited

U.S. PATENT DOCUMENTS

| | | | |
|---|---|---|---|
| 6,861,701 B2 * | 3/2005 | Williams et al. | ........... 257/329 |
| 2001/0028084 A1 * | 10/2001 | Mo | ........... 257/330 |
| 2004/0021174 A1 | 2/2004 | Kobayashi | |
| 2004/0183136 A1 | 9/2004 | Williams et al. | |
| 2004/0188756 A1 | 9/2004 | Matsuda | |
| 2005/0035402 A1 | 2/2005 | Venkatraman | |

OTHER PUBLICATIONS

International Search Report dated Apr. 23, 2007 in corresponding PCT Application No. PCT/US06/26316.

* cited by examiner

*Primary Examiner*—Michael Trinh
(74) *Attorney, Agent, or Firm*—Farjami & Farjami LLP

(57) ABSTRACT

A method of fabricating a power semiconductor device in which contact trenches are formed prior to forming the gate trenches.

20 Claims, 3 Drawing Sheets

EARLY CONTACT, HIGH CELL DENSITY PROCESS

RELATED APPLICATION

This application is based on and claims benefit of U.S. Provisional Application No. 60/696,855, filed on Jul. 6, 2005, entitled Early Contact, High Cell Density Process, to which a claim of priority is hereby made and the disclosure of which is incorporated by reference.

FIELD OF THE INVENTION

This invention relates to a process for the fabrication of semiconductor devices.

BACKGROUND OF THE INVENTION

Power semiconductor devices such as power MOSFETs are well known. Power MOSFETs are prevalently used in power control and conversion applications. One well known power application is DC-DC conversion.

DC-DC converters may be used in battery operated devices such as portable computers, portable telephones, and personal digital assistants to regulate the amount of power supplied from the battery to the device. The life of the battery in a portable device depends on the efficiency of its power circuitry. The ever-increasing demands for greater power supply and longer lasting battery power have, therefore, made efficiency in DC-DC converters an important factor for designers.

The efficiency of a DC-DC converter can be improved if certain characteristics of the semiconductor switching devices of the converter are improved. For example, when power MOSFETs are used in a DC-DC converter lowering of the on-resistance and increasing the current capability of the MOSFETs will contribute significantly to the efficiency.

One way to improve the key characteristics of a power MOSFET, for example, the ON resistance of a MOSFET, is to increase the density of the cells of its active area. The increase in the cell density in a power MOSFET, however, may be restricted by the condition of the material used to form the device and the inherent limitations of the process used.

In a typical process for fabricating a trench-type power semiconductor device that includes gate trenches as well as source contact trenches (trenches which allow the source electrode to make electrical contact with the base region) the gate trenches are formed first prior to forming the contact trenches. This process introduces a variability which limits the cell density that can be achieved, thus limiting the current carrying capability that may be attained by increasing the cell density.

It is thus desirable to overcome the limitations of the prior art in order to obtain a device with a higher density of active cells.

BRIEF DESCRIPTION OF THE INVENTION

In a conventional plug spacer process, the trenches are photo defined with a mask, but then rely on etch back of a plug spacer to form the contacts. Thus, a conventional plug spacer process is very sensitive to the variability of the plug spacer thickness and requires tight control over the etch process. In accordance with the invention, contact trenches are formed prior to forming the gate trenches. As a result the variability at the "back end" of thickness and etch control of the die relative to a plug spacer can be eliminated, whereby cell density can be increased.

A method for fabricating a power semiconductor device according to the present invention includes forming a plurality of spaced contact trenches in a semiconductor body of one conductivity, the contact trenches extending to a first depth in the semiconductor body, and each being adjacent a semiconductor mesa, forming a base region of another conductivity in the semiconductor body, the base region extending to a second depth below the first depth, filling the trenches with a filler material to form a filler body in each trench, forming gate trenches in each mesa, each gate trench extending to a depth below the second depth, forming a gate structure in each trench, each gate structure including gate insulation and a gate electrode, and depositing electrically conductive material to serve as a power electrode to fill said contact trenches.

Thus, according to the present invention contact trenches are formed before forming the gate trenches.

In an alternative embodiment, the base region may be formed after the contact trenches are filled.

In the preferred embodiment, the gate trenches are formed by removing a portion of each mesa to render each filler body proud relative to the semiconductor body, forming spacers on the sidewalls of each filler body to define regions of the semiconductor body to be removed in order to form gate trenches, and then removing the semiconductor material to define gate trenches therein. The spacers and the fillers can then be used as a mask for implanting source implants through an angled implantation for forming the source regions. Alternatively, the spacers can be removed totally or partially to form source region in a conventional manner.

Other features and advantages of the present invention will become apparent from the following description of the invention which refers to the accompanying drawings.

DETAILED DESCRIPTION

Figure 1:
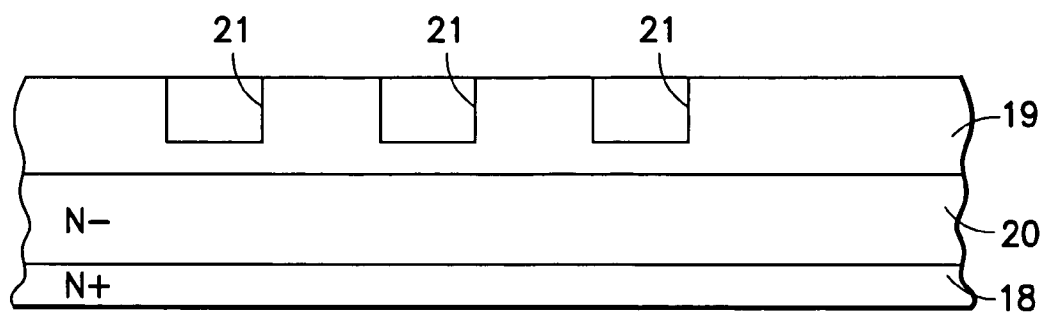
FIGS. 1-8 illustrate a process for fabricating a power MOSFET according to the present invention.

Referring to FIG. 1, a silicon body 20 of, for example, N type variety is etched to form a plurality of contact trenches 21. Spaced contact trenches 21 may be, for example, about 0.4 microns wide and spaced about 0.4 microns apart. Silicon body 20 is preferably an epitaxially formed silicon body residing over a silicon substrate 18 of the same conductivity but higher concentration of dopants.

After contact trenches 21 are formed, a base region 19 (sometimes referred to as body region or channel region) of a conductivity opposite to that of silicon body 20 (e.g. P type) is formed in silicon body 20 by diffusion or implantation and diffusion. It should be noted that base region 19 extends at least to a depth below that of contact trenches 21.

Figure 2:
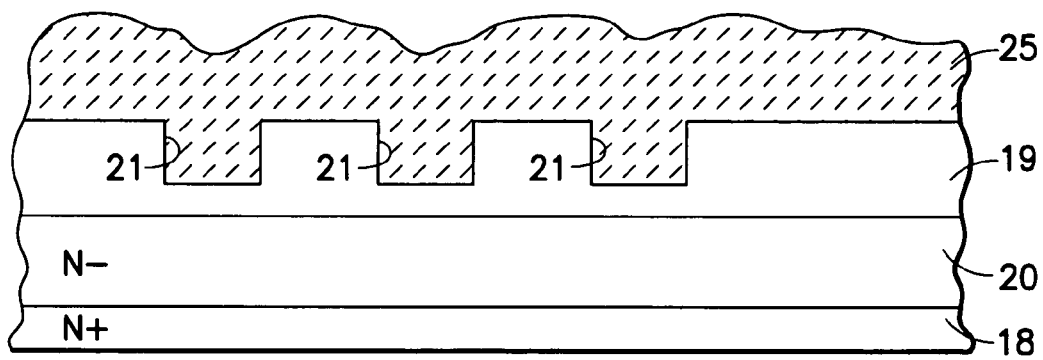
Figure 3:
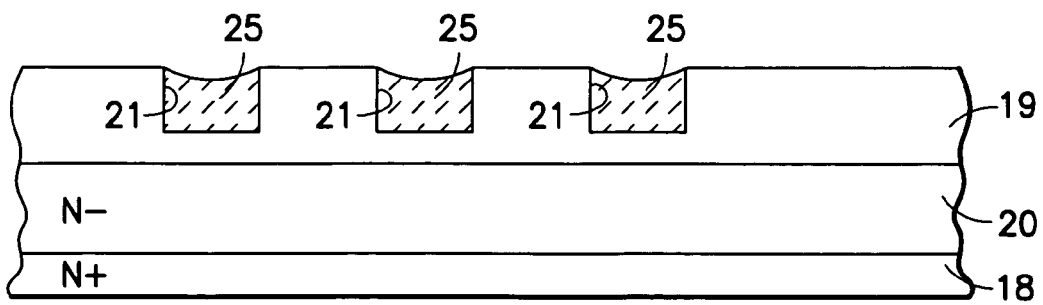

Referring next to FIG. 2, a filler material which may be, for example, an insulation mask material such as silicon nitride or SOG 25 is then deposited over the surface of silicon body 20, filling trenches 21. The filler material 25 is then etched back as shown in FIG. 3. Note that in an alternative embodiment base region 19 can be formed after filler bodies 25 are formed, or prior to forming contact trenches 21.

Figure 4:
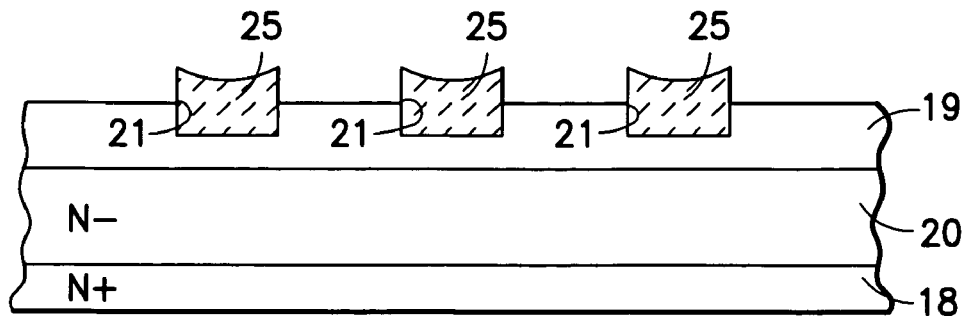

Thereafter, as shown in FIG. 4, the top surface of the silicon body 20 is etched back so that the insulation fillers 25 are rendered proud relative to the top surface of silicon body 20.

Figure 5:
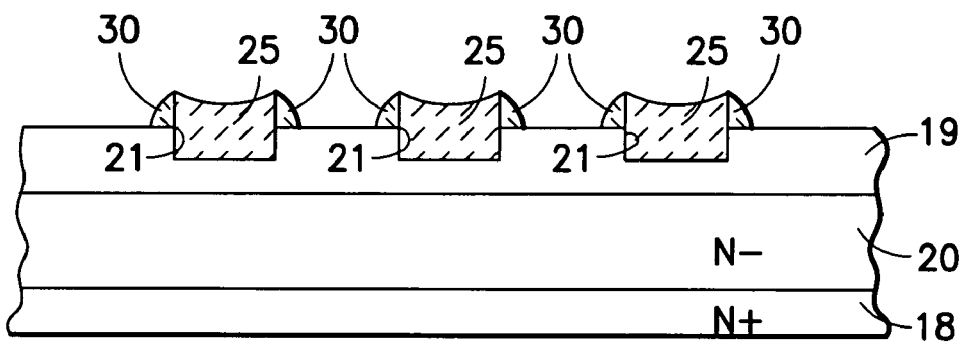
Figure 6:
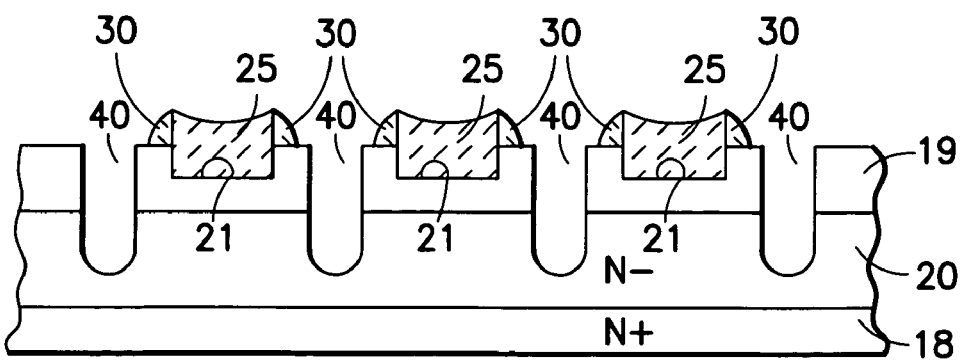

Referring next to FIG. 5, if narrow gate trenches are desired, spacers 30 of oxide or the like are defined on the protruding walls of fillers 25. Spacers 30 function as a mask to define regions in silicon body 20 that are to be etched in order to form the gate trenches. Thereafter, using spacers 30, gate trenches 40 are etched into silicon body 20. Note that gate trenches 40 extend to a depth below that of base region 19.

Figure 7:
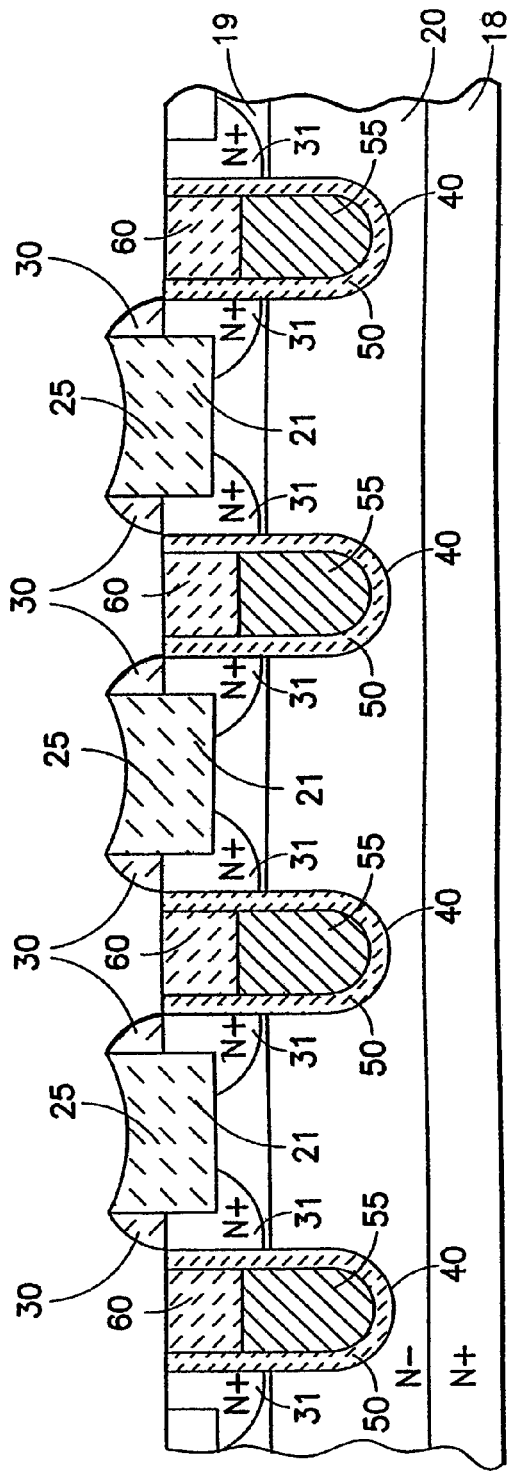

Referring next to FIG. 7, N$^+$ source regions 31 are formed in base region 19 preferably through angled implantation (followed by an activation step) using fillers 25 and spacers 30 as a mask. Alternatively, spacers can be removed totally or partially and a conventional source implant can be carried out.

Gate oxide 50 is then grown on the walls and bottoms of gate trenches 40 and conductive polysilicon is then deposited on the die surface and etched, leaving gate polysilicon electrodes 55 in gate trenches 40. Oxide plugs 60 are then formed atop polysilicon electrodes 55.

Figure 8:
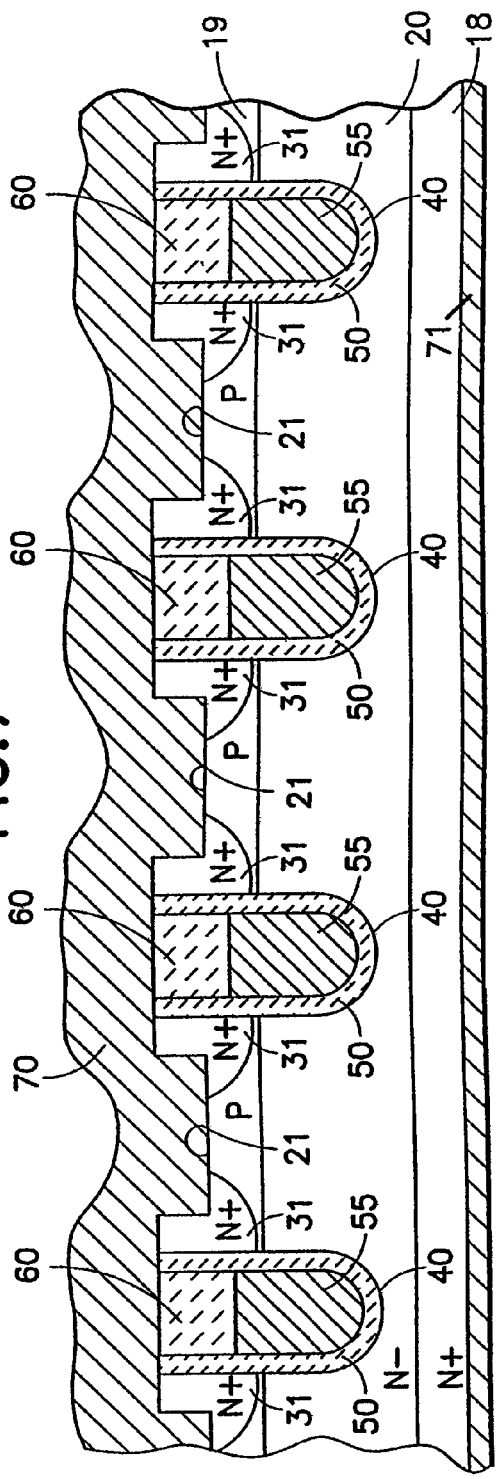

Referring next to FIG. 8, fillers 25 and spacers 30 are etched away and source electrode 70 is deposited through sputtering of aluminum, aluminum silicon or the like, filling contact trenches 21 and contacting source regions 31 and the base region 19 at the bottoms of contact trenches 21. Note that, preferably, prior to source electrode 70 deposition a highly conductive contact region of the same polarity as base region 19 may be formed at the bottom of each contact trench 21 to reduce the contact resistance between source electrode 70 and base region 19. Thereafter a drain electrode 71 is formed on substrate 18 by sputtering of aluminum, or aluminum silicon or the like metal.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method for manufacturing a power semiconductor device, comprising:
   forming a plurality of spaced contact trenches in a semiconductor body of one conductivity, said trenches extending to a first depth in said semiconductor body, and each being adjacent a semiconductor mesa;
   filling said trenches with a filler material to form a filler body in each trench;
   forming a base region of another conductivity in said semiconductor body, said base region extending to a second depth below said first depth;
   forming gate trenches in each said semiconductor mesa, each gate trench extending to a depth below said second depth;
   forming a gate structure in each trench, each gate structure including gate insulation and a gate electrode;
   removing said filler body from said contact trenches; and
   depositing electrically conductive material to serve as a power electrode, to fill said contact trenches, and to make electrical connection to said base region at bottom of said contact trenches.

2. The method of claim 1, further comprising forming source regions in said base region adjacent each gate trench by an angle implant.

3. The method of claim 1, wherein said filler material is comprised of silicon nitride or SOG.

4. The method of claim 1, wherein said conductive material is aluminum.

5. The method of claim 1, wherein said conductive material is aluminum silicon.

6. The method of claim 1, further comprising forming a conductive region of said another conductivity at the bottom of each contact trench inside said base region.

7. The method of claim 1, further comprising forming another power electrode on said semiconductor body opposite said power electrode.

8. The method of claim 1, wherein said semiconductor body includes an epitaxial layer formed over a substrate, said contact trenches and said gate trenches being formed in said epitaxial layer.

9. A method for manufacturing a power semiconductor device, comprising:
   forming a plurality of spaced contact trenches in a semiconductor body of one conductivity, said trenches extending to a first depth in said semiconductor body, and each being adjacent a semiconductor mesa;
   filling said trenches with a filler material to form a filler body in each trench;
   forming a base region of another conductivity in said semiconductor body, said base region extending to a second depth below said first depth;
   forming gate trenches in each said semiconductor mesa, each gate trench extending to a depth below said second depth;
   forming a gate structure in each trench, each gate structure including gate insulation and a gate electrode;
   removing said filler body from said contact trenches; and
   depositing electrically conductive material to serve as a power electrode and to fill said contact trenches;
   wherein said gate trenches are formed by removing a portion of each said semiconductor mesa to render each filler body raised relative to said semiconductor body, forming spacers on sidewalls of each mask filler body to define regions of said semiconductor body to be removed to form said gate trenches; and removing semiconductor material vertically from said defined regions to form gate trenches.

10. The method of claim 9, wherein said spacers are comprised of an oxide.

11. A method for manufacturing a power semiconductor device, comprising:
   forming a plurality of spaced contact trenches in a semiconductor body of one conductivity, each contact trench adjacent a mesa, said contact trenches extending to a depth above a depth of a base region of another conductivity in said semiconductor body;
   filling said trenches with a filler material to form a filler body in each contact trench;
   forming gate trenches in each mesa, each gate trench extending to a depth below said depth of said base region;
   forming a gate structure in each trench, each gate structure including gate insulation and a gate electrode;
   removing said filler body from said contact trenches; and
   depositing electrically conductive material to serve as a power electrode, to fill said contact trenches, and to make electrical connection to said base region at bottom of said contact trenches.

12. The method of claim 11, further comprising forming source regions in said base region adjacent each gate trench by an angle implant.

13. The method of claim 12, wherein said filler material is comprised of silicon nitride or SOG.

14. The method of claim 11, wherein said conductive material is aluminum.

15. The method of claim 11, wherein said conductive material is aluminum silicon.

16. The method of claim 11, further comprising forming a highly conductive region of said another conductivity at the bottom of each contact trench.

17. The method of claim 11, further comprising forming another power electrode on said semiconductor body opposite said power electrode.

18. The method of claim 11, wherein said semiconductor body includes an epitaxial layer formed over a substrate, said contact trenches and said gate trenches being formed in said epitaxial layer.

19. A method for manufacturing a power semiconductor device, comprising:

forming a plurality of spaced contact trenches in a semiconductor body of one conductivity, each contact trench adjacent a mesa, said contact trenches extending to a depth above a depth of a base region of another conductivity in said semiconductor body above;

filling said trenches with a filler material to form a filler body in each contact trench;

forming gate trenches in each mesa, each gate trench extending to a depth below said depth of said base region;

forming a gate structure in each trench, each gate structure including gate insulation and a gate electrode;

removing said filler body from said contact trenches; and depositing electrically conductive material to serve as a power electrode and to fill said contact trenches;

wherein said gate trenches are formed by removing a portion of each said semiconductor mesa to render each filler body raised relative to said semiconductor body, forming spacers on sidewalls of each mask filler body to define regions of said semiconductor body to be removed to form said gate trenches; and removing semiconductor material from said defined regions to form gate trenches.

20. The method of claim 19, wherein said spacers are comprised of an oxide.

* * * * *